US010879912B1

(12) United States Patent
Gambhir et al.

(10) Patent No.: US 10,879,912 B1
(45) Date of Patent: *Dec. 29, 2020

(54) DIGITAL PHASE LOCKED LOOP SYSTEM

(71) Applicant: MARVELL INTERNATIONAL LTD., Hamilton (BM)

(72) Inventors: Manisha Gambhir, Cupertino, CA (US); Ahmed Hesham Mostafa, San Jose, CA (US); Myung Jae Yoo, Sunnyvale, CA (US); Zubir Adal, Union City, CA (US)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/458,672

(22) Filed: Jul. 1, 2019

Related U.S. Application Data

(63) Continuation of application No. 15/900,002, filed on Feb. 20, 2018, now Pat. No. 10,340,927.

(60) Provisional application No. 62/462,479, filed on Feb. 23, 2017.

(51) Int. Cl.
*H03L 7/099* (2006.01)
*H03L 7/093* (2006.01)
*H03L 7/095* (2006.01)

(52) U.S. Cl.
CPC ............ *H03L 7/0992* (2013.01); *H03L 7/093* (2013.01); *H03L 7/095* (2013.01)

(58) Field of Classification Search
CPC ......... G06F 1/00; G06F 1/04; H03K 2005/00; H03K 2005/00234; H03K 5/00; H03K 5/132; H03K 5/135; H03L 7/00; H03L 7/02; H03L 7/093; H03L 7/095; H03L 7/0992

USPC ......................................................... 327/150
See application file for complete search history.

(56) References Cited

U.S. PATENT DOCUMENTS

| 8,362,815 | B2 | 1/2013 | Pavlovic et al. |
| 9,013,216 | B2 | 4/2015 | Boo et al. |
| 9,025,965 | B2 * | 5/2015 | Lee ........................... H03L 1/00 398/155 |
| 9,231,602 | B1 * | 1/2016 | Banin ................... G04F 10/005 |

(Continued)

OTHER PUBLICATIONS

Analog Devices, MT-086 Tutorial, "Fundamentals of Phase Locked Loops (PLLs)", Oct. 2008, 10 pages.

(Continued)

*Primary Examiner* — Lincoln D Donovan
*Assistant Examiner* — Dave Mattison

(57) ABSTRACT

A method includes receiving data for a desired output frequency of an output clock of a phase locked loop (PLL) circuit. The method includes determining a preset value for a digitally controlled oscillator (DCO) of the PLL circuit, determining first gain coefficients and second gain coefficients for a filter of the PLL circuit, and determining ratio values for a divider circuit of the PLL circuit based on the data. The method includes providing the preset value to the DCO, the first gain coefficients to the filter, and the ratio values to the divider circuit while the PLL circuit operates in an open-loop configuration. The method includes subsequently operating the PLL circuit in a closed-loop configuration by connecting the filter to the DCO, and providing the second gain coefficients to the filter in response to detecting a phase lock of the PLL circuit operating in the closed-loop configuration.

18 Claims, 3 Drawing Sheets

(56) References Cited

U.S. PATENT DOCUMENTS

| | | |
|---|---|---|
| 9,337,850 B2 | 5/2016 | Moehlmann |
| 9,520,885 B1 | 12/2016 | Luo et al. |
| 9,831,880 B1* | 11/2017 | Kuan ...................... H03L 7/093 |
| 2010/0141347 A1* | 6/2010 | Hsiao ...................... H03L 1/022 |
| | | 331/17 |
| 2017/0288686 A1* | 10/2017 | Gao ........................ H03L 7/091 |
| 2018/0095119 A1* | 4/2018 | Chillara ................ H03L 7/0993 |

OTHER PUBLICATIONS

Skyworks, Wideband PLL Programming Guide, "Skyworks Wideband Integer-N, Phase-Locked Loop", Mar. 17, 2014, 24 pages.

* cited by examiner

DIGITAL PHASE LOCKED LOOP SYSTEM

CROSS-REFERENCE TO RELATED APPLICATIONS

This disclosure is a continuation of U.S. application Ser. No. 15/900,002 filed on Feb. 20, 2018 (now U.S. Pat. No. 10,340,927), titled "Digital Phase Locked Loop System," which claims the benefit of priority under 35 U.S.C. § 119(e) of U.S. Provisional Application No. 62/462,479 filed on Feb. 23, 2017, titled "Fast Settling, Highly Adaptable Digital Phase Locked Loop That Has Varying Bandwidth To Reduce Loop Settling Time While Maintaining Stability And Jitter Performance." The entire disclosures of the applications referenced above are incorporated herein by reference.

BACKGROUND

The present disclosure relates to digital phase locked loops.

A phase locked loop (PLL) circuit can be used to generate signals with a range of frequencies from a clean reference clock source. In some applications, a fast phase locking over a wide frequency range is desired to improve time utilization. An example of such an application is a disk drive storage device with a PLL circuit that may be required to settle within 100 to 200 nanoseconds for a frequency change as high as 15%. Such a fast settling requirement may translate to increased PLL bandwidth (e.g., in the order of tens of megahertz) and phase margin for optimum settling characteristics. However, a PLL circuit with a high bandwidth may be difficult to implement and may exhibit poor performance.

SUMMARY

The present disclosure describes systems and techniques related to a digital PLL system that provides a fast settling time (e.g., 200 nanoseconds or less) in response to a change in the desired output frequency. In general, in one aspect, a system includes a phase locked loop (PLL) circuit and a digital control unit coupled with the PLL circuit. The PLL circuit includes a time-to-digital converter (TDC) configured to compare a reference clock signal to a feedback clock signal to generate an error signal, a digital loop filter configured to process the error signal in accordance with gain coefficients to generate an oscillator control signal, a digitally controlled oscillator (DCO) configured to generate an output clock signal based on the oscillator control signal while the PLL circuit is operating in a closed-loop configuration, and a divider circuit configured to generate the feedback clock signal from the output clock signal in accordance with N/R values. The digital control unit includes circuitry that is configured to receive a frequency word corresponding to a desired output frequency of the output clock signal; determine a preset value for the DCO corresponding to the received frequency word; determine initial gain coefficients and final gain coefficients for the digital loop filter corresponding to the received frequency word, where each of the initial gain coefficients has a larger value than a corresponding final gain coefficient; determine N/R values for the divider circuit corresponding to the received frequency word; while the PLL circuit is operating in an open-loop configuration, provide the determined preset value to the DCO, the determined initial gain coefficients to the digital loop filter, and the determined N/R values to the divider circuit; after providing the determined preset value, the determined initial gain coefficients, and the determined N/R values, initiate operation of the PLL circuit in the closed-loop configuration; and in response to detection of a phase lock of the PLL circuit operating in the closed-loop configuration, provide the determined final gain coefficients to the digital loop filter.

In another aspect, an apparatus includes control circuitry configured to couple with a phase locked loop (PLL) circuit and a non-volatile memory device encoded with instructions that when executed by the control circuitry cause the control circuitry to perform operations including receive a frequency word corresponding to a desired output frequency of an output clock signal of the PLL circuit; determine a preset value for a digitally controlled oscillator (DCO) of the PLL circuit corresponding to the received frequency word; determine initial gain coefficients and final gain coefficients for a digital loop filter of the PLL circuit corresponding to the received frequency word, where each of the initial gain coefficients has a larger value than a corresponding final gain coefficient; determine N/R values for a divider circuit of the PLL circuit corresponding to the received frequency word; while the PLL circuit is operating in an open-loop configuration, provide the determined preset value to the DCO, the determined initial gain coefficients to the digital loop filter, and the determined N/R values to the divider circuit; after providing the determined preset value, the determined initial gain coefficients, and the determined N/R values, initiate operation of the PLL circuit in a closed-loop configuration; and in response to detection of a phase lock of the PLL circuit operating in the closed-loop configuration, provide the determined final gain coefficients to the digital loop filter.

In another aspect, a method includes receiving a frequency word corresponding to a desired output frequency of an output clock signal of a phase locked loop (PLL) circuit; determining a preset value for a digitally controlled oscillator (DCO) of the PLL circuit corresponding to the received frequency word; determining initial gain coefficients and final gain coefficients for a digital loop filter of the PLL circuit corresponding to the received frequency word, where each of the initial gain coefficients has a larger value than a corresponding final gain coefficient of the final gain coefficients; determining N/R values for a divider circuit of the PLL circuit corresponding to the received frequency word; while the PLL circuit is operating in an open-loop configuration, providing the determined preset value to the DCO, the determined initial gain coefficients to the digital loop filter, and the determined N/R values to the divider circuit; after providing the determined preset value, the determined initial gain coefficients, and the determined N/R values, initiating operation of the PLL circuit in a closed-loop configuration; and in response to detection of a phase lock of the PLL circuit operating in the closed-loop configuration, providing the determined final gain coefficients to the digital loop filter.

The described systems and techniques can be implemented so as to realize one or more of the following advantages. The digital PLL system may provide a fast settling time while reducing reliance on an impractically high bandwidth. The bandwidth and stability margins of the digital PLL system can be accurately and reliably set while maintaining loop stability to achieve fast settling. The bandwidth of the PLL circuit can be significantly increased during initial phase acquisition in order to achieve fast settling and dynamically changed after the PLL circuit has settled to reduce noise and/or jitter.

DESCRIPTION

Figure 1:
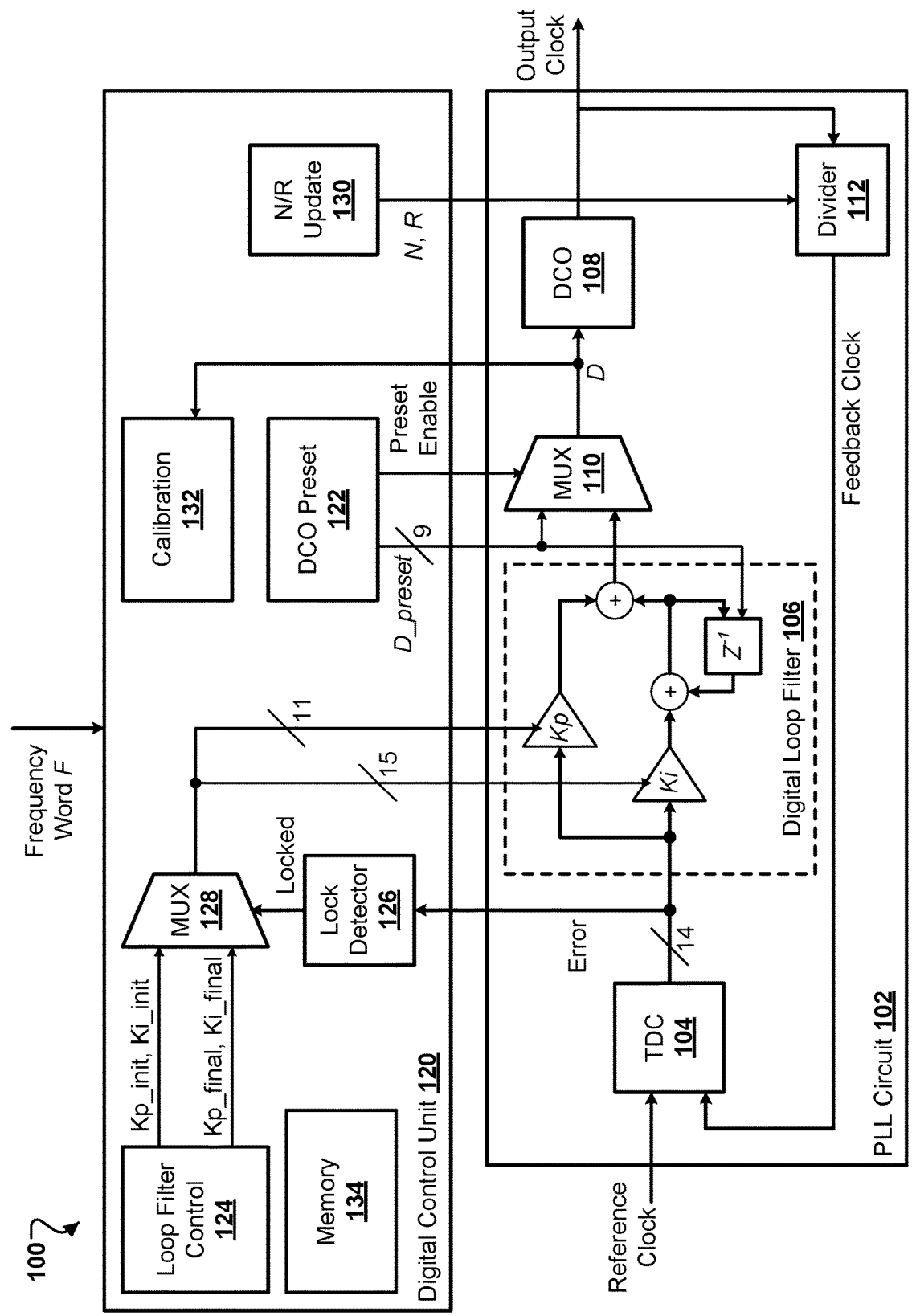
FIG. 1 is a block diagram showing an example of a digital PLL system.

FIG. 1 is a block diagram showing an example of a digital PLL system 100 that can achieve fast settling in response to a change in the desired output frequency. The digital PLL system 100 includes a PLL circuit 102 and a digital control unit 120.

The PLL circuit 102 generates a high frequency output clock using a reference clock from a clean low frequency source. The output clock has a frequency $F_{out}$ that is a multiple of the reference clock frequency $F_{ref}$ as follows:

$$F_{out} = \left(N + \frac{R}{2^m}\right)F_{ref}$$

where N is the integral component of the ratio and R is the fractional component having an m-bit resolution. The PLL circuit 102 achieves phase (and frequency) locking by sensing and integrating the phase error between the reference clock and the generated output clock. The PLL circuit 102 minimizes the phase error between the feedback clock and the reference clock to generate the output clock.

The PLL circuit 102 includes a time-to-digital converter (TDC) 104 that compares the phase of the reference clock to the phase of the feedback clock and generates an error signal in the digital domain. The error signal is proportional to the phase difference between the reference clock and the feedback clock.

The PLL circuit 102 includes a digital loop filter 106 that sets the bandwidth for the digital PLL system 100 to achieve fast settling in response to a change in the desired output frequency. The digital loop filter 106 processes the error signal provided by the TDC 104 to generate an oscillator control signal. The digital loop filter 106 may include an infinite impulse response (IIR) filter that provides a proportional integral (PI) control of the PLL circuit 102 through two filtering paths: a proportional path with a gain coefficient of Kp, and an integral path with a gain coefficient of Ki. The transfer function of such an IIR filter in the discrete domain is given by:

$$H(z) = Kp + \frac{Ki}{1 - z^{-1}}$$

where Kp and Ki are digital coefficients computed and applied by the digital control unit 120. The digital loop filter 106 may include a full resolution digital filter.

The PLL circuit 102 includes a digitally controlled oscillator (DCO) 108. To facilitate coverage of a wide range of frequencies, operation of the DCO 108 can be divided into distinct frequency ranges. For each of the frequency ranges, the DCO 108 generates the output clock signal with the frequency $F_{out}$ in response to a digital control word D.

The PLL circuit 102 includes a multiplexer 110 that provides the digital control word D to the input of the DCO 108. A present operation may be used to shorten the time for frequency locking of the PLL circuit 102. During the preset operation, the multiplexer 110 disconnects the digital loop filter 106 from the DCO 108 so that the PLL circuit 102 operates in an open-loop configuration and provides a preset value D_preset from the digital control unit 120 as the digital control word D to the input of the DCO 108. During closed-loop operation of the PLL circuit 102, the multiplexer 110 connects the digital loop filter 106 with the DCO 108 and provides the oscillator control signal generated by the digital loop filter 106 as the digital control word D to the input of the DCO 108.

The PLL circuit 102 includes a divider circuit 112 that divides the output clock by a programmable number defined by the N and R values to generate a feedback clock having a frequency $F_{fb}$. The frequency of the output clock and the frequency of the feedback clock are related as follows:

$$F_{fb} = \frac{F_{out}}{N + \frac{R}{2^m}}.$$

The digital control unit 120 controls the states and sequential operation of the PLL circuit 102. The digital control unit 120 performs an initial calibration of the PLL circuit 102 and stores the results from the initial calibration for later use during preset and closed loop operations of the PLL circuit 102. The initial calibration can enable the digital control unit 120 to accurately and reliably set the bandwidth and stability margins of the PLL circuit 102. The ability to set the bandwidth while maintaining the stability of the PLL circuit 102 facilitates fast settling of the PLL circuit 102.

The digital control unit 120 also determines a preset value for the DCO 108 and initial gain coefficients for the digital loop filter 106. The digital control unit 120 applies the preset value to the DCO 108 and the initial gain coefficients to the digital loop filter 106 so that initial error in frequency and phase are minimized when the PLL circuit 102 is switching frequencies. This minimizes the initial error that the PLL circuit 102 has to correct, thereby improving the settling time and reducing reliance on an impractically high bandwidth for the PLL circuit 102.

The digital control unit 120 also controls the operation of the PLL circuit 102 by generating control signals for the preset and closed loop operations, and signals for post-lock control of the digital PLL system 100. The digital control unit 120 can set the PLL circuit 102 for wide bandwidth during initial settling and then dynamically change the bandwidth after a locked state is achieved. During the initial phase acquisition, the digital control unit 120 determines gain coefficients for the digital loop filter 106 to significantly boost the bandwidth in order to achieve faster loop dynamics. Once the digital control unit 120 determines that the PLL circuit 102 is locked/settled, the bandwidth of the PLL circuit 102 is scaled back by changing the gain coefficients of the digital loop filter 106, which can reduce the noise/jitter contribution from the TDC 104 and input path of the reference clock.

Portions of the digital PLL system 100 may be implemented by one or more units or modules. For example, the multiplexer 110 and the DCO 108 may be implemented by a single unit or by additional units. Additionally, the loop filter control module 124 and the multiplexer 128 may be implemented by a single module or by additional modules. The digital control unit 120 may be implemented using appropriate circuitry, such as an application-specific integrated circuit (ASIC), a field-programmable gate array (FPGA), or a microcontroller.

Figure 2:
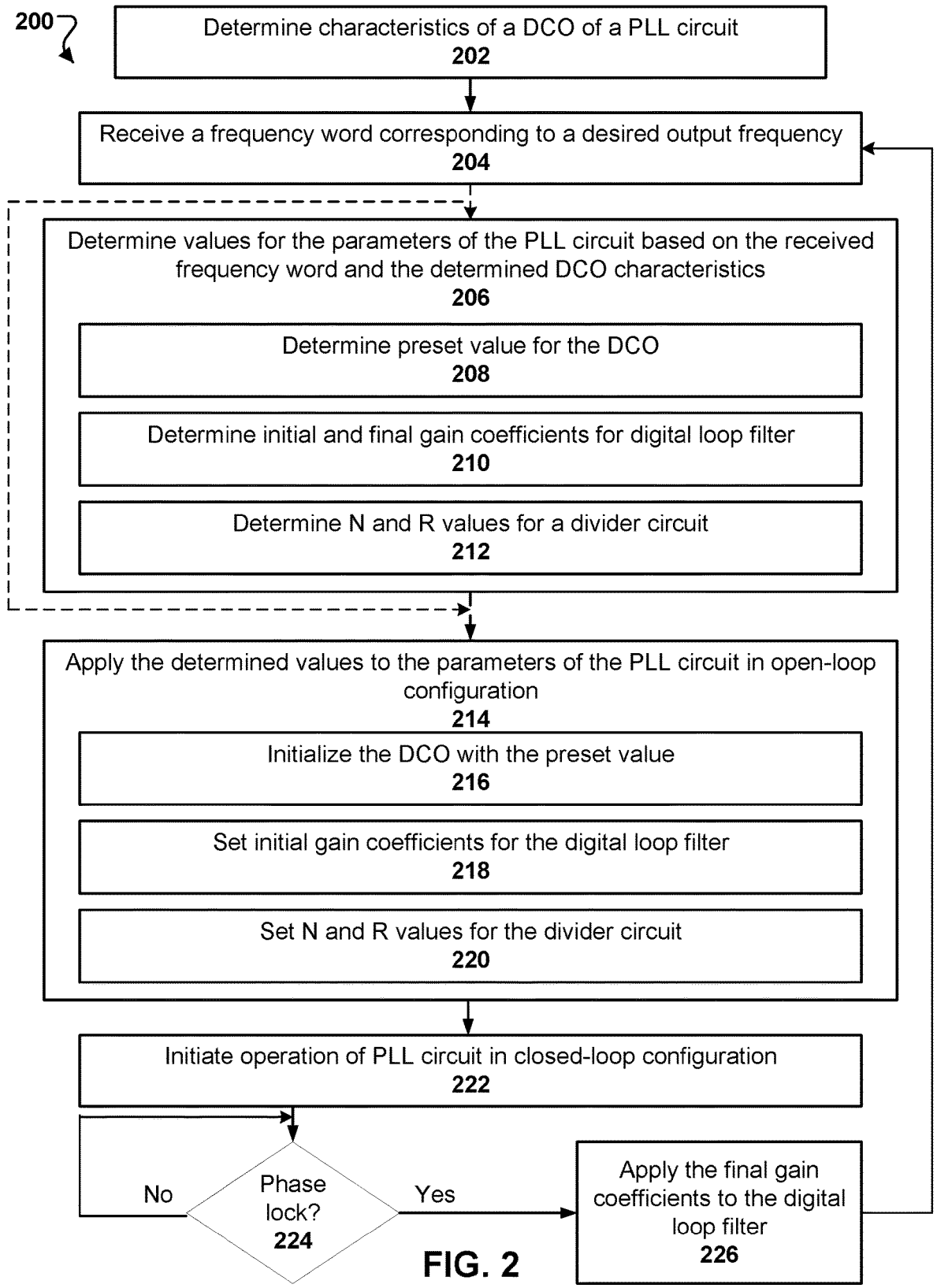
FIG. 2 is a flowchart showing examples of operations performed by a digital control unit of the digital PLL system.

FIG. 2 is a flowchart showing examples of operations 200 performed by the digital control unit 120 of the digital PLL system 100 of FIG. 1. FIG. 2 will be described in conjunction with FIG. 1. The operations 200 may include details that have been discussed above. In some implementations, the operations 200 may be implemented as one or more modules of program instructions encoded on one or more memory devices 134 for execution by, or to control the operation of, the digital control unit 120.

The digital control unit 120 includes a calibration module 132 that performs an initial calibration of the PLL circuit 102 when the digital PLL system 100 is powered on to determine characteristics of the DCO 108 for supporting the preset and closed loop operations of the PLL circuit 102 (at 202). During the initial calibration, the PLL circuit 102 is operated and allowed to lock at two frequency end-points, F1 and F2, for each of the frequency ranges. For each locked frequency end-point, the calibration module 132 stores a DCO control word along with the corresponding frequency word in a memory device 134.

Figure 3:
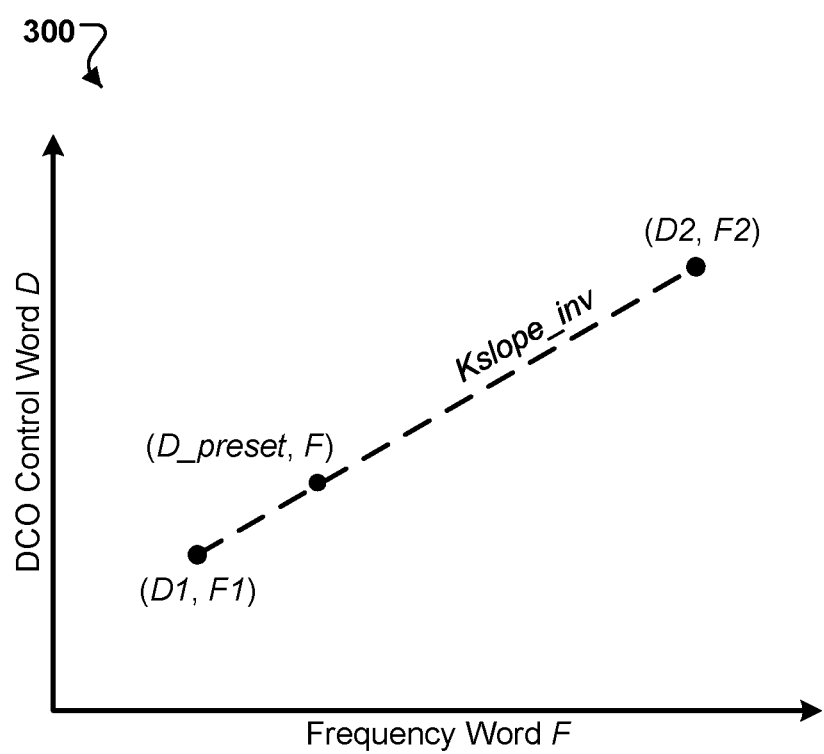
FIG. 3 is a graph showing an example of a graph representing characteristics of a digitally controlled oscillator of the digital PLL system.

FIG. 3 shows an example of a graph 300 representing characteristics of the DCO 108 for a frequency range including frequencies F1 to F2. The graph 200 includes the locked frequency end-point and corresponding DCO control word pairs, (D1, F1) and (D2, F2), for the frequency range. The frequency end-point and DCO control word pairs are used by the calibration module 132 to determine a linearized two-point approximation of DCO characteristics Kslope_inv, which is the inverse of the linearized DCO gain Kdco and given by:

$$\text{Kslope\_inv} = \frac{D2 - D1}{F2 - F1}.$$

After performing the initial calibration, the digital control unit 120 receives a frequency word F corresponding to a desired output frequency (at 204). The digital PLL system 100 performs four stages of operation in response to receiving a frequency word F. The four stages include a computation stage, a preset stage, a pre-locked closed loop stage, and a postlocked closed loop stage.

During the computation stage, the digital control unit 120 uses the received frequency word F to determine appropriate values for the parameters of the components of the PLL circuit 102 (at 206). The digital control unit 120 includes a DCO preset module 122 that determines a preset value for the DCO 108 (at 208), a loop filter control module 124 that determines the initial and final gain coefficients for the digital loop filter 106 (which in turn sets the bandwidth and stability margins of the PLL circuit 102) (at 210), and an N/R update module 130 that determines the N and R values corresponding to the frequency word F (at 212).

The DCO preset module 122 determines the appropriate preset value for the DCO 108 (at 208). Using the DCO characteristics, e.g., as shown by graph 300 of FIG. 3, that were determined during the initial calibration and stored in the storage medium 134, the DCO preset module 122 determines a DCO control word representing the preset value D_preset that corresponds to a free running frequency that is close to the desired output frequency. The DCO control word for the preset value D_preset is determined based on the linearized two-point approximation of DCO characteristics Kslope_inv between the frequency end-points, F1 and F2, of the frequency range including the desired output frequency corresponding to the received frequency word F.

The loop filter control module 124 determines the initial and final gain coefficients, Kp and Ki, for the digital loop filter 106 (at 210). For the initial settling stage, the initial gain coefficients are selected such that Kp=Kp_init and Ki=Ki_init are for a wide bandwidth operation where the limit on the bandwidth BW is given by:

$$Bw \approx \frac{F_{ref}}{5}.$$

The loop filter control module 124 determines the initial gain coefficients of the digital loop filter 106 (thereby setting the dynamics of the PLL circuit 102) to achieve a desired settling time. For example, to achieve a settling time of approximately 200 nanoseconds, the loop filter control module 124 targets a bandwidth in the order of 10 MHz and a phase margin of approximately 65 degrees. The loop filter control module 124 can determine the initial gain coefficients corresponding to the targeted bandwidth BW and phase margin PM through the following relationships:

$$\text{Kp\_init} = Tdc \times F \times \text{Kslope\_inv}\left(\frac{Wc^2}{\sqrt{Wc^2 + Wz^2}}\right),$$

$$\text{Ki\_init} = \frac{\text{Kp\_init}}{\tan\left(\pi\frac{PM}{180}\right)} \times \frac{Wc}{F_{ref}},$$

$$Wz = \frac{Wc}{\tan\left(\pi\frac{PM}{180}\right)},$$

$$Wc = 2\pi \times BW$$

where Tdc is the resolution of the TDC 104 in seconds (which is a known design characteristic of the TDC 104), Kslope_inv is the linearized two-point approximation of DCO characteristics (which is the inverse of the linearized DCO gain Kdco) obtained during the initial calibration, and F is the frequency word corresponding to the desired output frequency.

For a conventional PLL circuit, the resolution for the gain coefficients Kp and Ki are approximated and chosen conservatively because the DCO gain is typically not known. To keep the conventional PLL circuit wieldy, gain coefficients may be selected as a power of 2. However, this approach may result in a loop bandwidth setting that is too conservative and inaccurate for achieving fast settling. Thus, for the digital PLL system 100, bit widths of gain coefficients Kp and Ki are selected to target certain accuracy in the bandwidth and phase margin. For example, in some implementations, resolution of Kp can be selected to target a bandwidth accuracy of 5%, and resolution of Ki can be selected to target a phase margin accuracy of 2.5 degrees. By obtaining the characteristics of the DCO 108 during initial calibration and implementing the digital loop filter 106 in full resolution of the gain coefficients, the dynamics for wide bandwidth of the PLL circuit 102 can be accurately set while maintaining reasonable stability margins.

After determining the preset value for the DCO 108, the gain coefficients for the digital loop filter 106, and the N and R values corresponding to the frequency word F, the digital PLL system 100 proceeds to the preset stage where the digital control unit 120 applies the determined values to the parameters of the PLL circuit 102 in an open-loop configuration (at 214). During the preset stage, the digital control unit 120 initializes the DCO 108 using the preset value D_preset (at 216), sets the initial gain coefficients Kp_init and Ki_init of the digital loop filter 106 (at 218), and sets the N and R values of the divider circuit 112 (at 220).

The DCO preset module 122 initializes the DCO 108 using the preset value D_preset (at 216) by asserting a preset enable flag that is provided to the multiplexer 110. Based on the asserted preset enable flag, the multiplexer 110 selects the input that is coupled to the output of the DCO preset module 122 to provide the preset value D_preset to the DCO 108. This causes the PLL circuit 102 to operate in the open-loop configuration. Initializing the DCO 108 using the preset value D_preset may ensure that the free running frequency of the DCO 108 is very close (within a specified error bound, e.g., around 2-3% for frequency jumps up to 10%) to the desired output frequency corresponding to the frequency word F.

While the multiplexer 110 is providing the preset value D_preset to the DCO 108, the digital control unit 120 sets the initial gain coefficients Kp_init and Ki_init of the digital loop filter 106 (at 218). To set the initial gain coefficients, the digital control unit 120 includes a lock detector module 126 and a multiplexer 128. The lock detector module 126 detects whether the PLL circuit 102 is in a locked state by polling the output of the TDC 104. The lock detector module 126 asserts a locked flag in response to detecting that the codes at the output of the TDC 104 remain bounded between a small predefined window for several cycles. The multiplexer 128 provides values for the gain coefficients based on the value of the locked flag. During the preset stage, the lock detector module 126 detects that the PLL circuit 102 is not in the locked state and thus does not assert the locked flag. Based on the unasserted locked flag, the multiplexer 128 provides the initial gain coefficients Kp_init and Ki_init to the digital loop filter 106.

Also during the preset stage, the N/R update module 130 of the digital control unit 120 sets the N and R values of the divider circuit 112 (at 220) to prepare the PLL circuit 102 for settling to the desired output frequency.

After setting the values of the PLL circuit 102 in the preset stage, the digital control unit 120 initiates the pre-locked closed loop stage of operation where the PLL circuit 102 operates in a closed-loop configuration (at 222). The DCO preset module 122 unasserts the preset enable flag, which causes the multiplexer 110 to provide the output of the digital loop filter 106 to the DCO 108.

Because the DCO 108 was previously initialized using the preset value during the preset stage, the frequency of the output clock is very close to the desired output frequency before the PLL circuit 102 is closed. With the frequency of the output clock being preset close to the desired output frequency, the PLL circuit 102 can seamlessly transition from the open-loop configuration to the closed-loop configuration with very little frequency error. Consequently, during the pre-locked closed loop stage, the PLL circuit 102 needs to acquire only the phase lock with very little delta in the frequency. Additionally, because the initial gain coefficients of the digital loop filter 106 were previously computed for wideband loop characteristics and set during the preset stage, the PLL circuit 102 can achieve ultra-fast phase acquisition.

The initial gain coefficients that are applied to the digital loop filter 106 during the pre-locked closed loop stage have relatively large values to achieve high initial loop bandwidth. This can result in allowing a greater component of noise from the TDC 104 and noise from the reference clock input path to pass, which can lead to undesirable jitter performance. To ameliorate this, the digital control unit 120 configures the PLL circuit 102 into the post-locked closed loop stage of operation after the phase has locked, where the digital control unit 120 dynamically scales down the gain coefficients of the digital loop filter 106.

When the lock detector module 126 detects that the PLL circuit 102 has locked (at 224), the lock detector module 126 asserts the locked flag, which causes the multiplexer 128 to provide the final gain coefficients Kp_final and Ki_final to the digital loop filter 106 (at 226). For a robust loop response, the gain coefficients are scaled down such that the bandwidth scales down by a known factor while the phase margin remains unchanged. For example, to scale down the bandwidth by a factor of two while preserving the phase margin, the final gain coefficients can be scaled down as follows:

$$\text{Kp\_final} = \frac{\text{Kp\_init}}{2} \text{ and Ki\_final} = \frac{\text{Ki\_init}}{4}.$$

The PLL circuit 102 operates in the closed-loop configuration with the digital loop filter 106 set with the final gain coefficients. When the digital control unit 120 receives a new frequency word corresponding to a new desired output frequency, the digital control unit 120 returns to operation 204 and operations 204-226 are repeated for the new desired output frequency.

In some implementations, the determined preset value for the DCO 108, the gain coefficients for the digital loop filter 106, and the N and R values for the divider 112 corresponding to the frequency word F is stored in a memory device 134 in association with the frequency word F. When the digital control unit 120 subsequently receives a frequency word (at 204) for which the preset value, the gain coefficients, and the N and R values have been previously calculated, the digital control unit 120 proceeds directly to operation 214 and loads the preset value to the DCO 108 (at 216), the gain coefficients to the digital loop filter 106 (at 218), and the N and R values to the divider 112 (at 220) from the memory device 134. The digital control unit 120 then proceeds to complete operations 222-226. When the digital control unit 120 receives a new frequency word corresponding to a new desired output frequency that has no associated values for the parameters of the components of the PLL circuit 102 stored in the memory device 134, the digital control unit 120 returns to operation 204 and operations 204-226 are repeated for the new desired output frequency.

In some implementations, the digital control unit 120 can determine the preset value for the DCO 108, the gain coefficients for the digital loop filter 106, and the N and R values for the divider 112 for a set of possible frequency words that can be received at operation time as part of the initial calibration and store the values in the memory device 134 for loading during operation time. Alternatively, the digital control unit 120 can perform the calculations during operation time as the frequency words are received.

As used herein, the term "assert" refers to providing a logical true value for a signal or a bit. A signal or bit may be asserted if it conveys a value indicative of a particular condition. Conversely, a signal or bit may be "unasserted" if it conveys a value indicative of a lack of a particular condition. A signal or bit may be defined to be asserted when it conveys a logical zero value, or conversely, when it conveys a logical one value, and the signal or bit may be defined as unasserted when the opposite logical value is conveyed.

A few implementations have been described in detail above, and various modifications are possible. The circuits described above may be implemented in electronic circuitry, such as the structural means disclosed in this specification and structural equivalents thereof. While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments. Other implementations fall within the scope of the following claims.

The wireless communications described in the present disclosure can be conducted in full or partial compliance with IEEE standard 802.11-2016, IEEE standard 802.16-2009, IEEE standard 802.20-2008, and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2016 may be supplemented by draft IEEE standard 802.11ah-2016 and/or draft IEEE standard 802.11ai-2016.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system comprising:
a phase locked loop (PLL) circuit comprising:
a time-to-digital converter (TDC) configured to compare a reference clock signal to a feedback clock signal to generate an error signal;
a filter configured to generate a control signal based on the error signal;
a digitally controlled oscillator (DCO) configured to generate an output clock signal based on the control signal;
a multiplexer configured to provide the control signal or a preset value to the DCO based on a preset enable signal, wherein the preset value is determined based on a linearized two-point approximation of DCO characteristics between two frequency end-points of a frequency range that includes a desired output frequency of the output clock signal; and
a divider circuit configured to generate the feedback clock signal from the output clock signal based on ratio values; and
a control circuit coupled to the PLL circuit, the control circuit configured to:
receive data for the desired output frequency of the output clock signal;
determine first gain coefficients and second gain coefficients for the filter, the preset value for the DCO, and the ratio values for the divider circuit based on the data;
provide the preset enable signal to the multiplexer, the preset value to the DCO, the first gain coefficients to the filter, and the ratio values to the divider circuit while the PLL circuit operates in an open-loop configuration;
subsequently operate the PLL circuit in a closed-loop configuration by connecting the filter to the DCO to provide the control signal to the DCO; and
provide the second gain coefficients to the filter in response to detecting a phase lock of the PLL circuit operating in the closed-loop configuration.

2. The system of claim 1, wherein each of the first gain coefficients is greater than a corresponding one of the second gain coefficients.

3. The system of claim 1, wherein the control circuit is configured to:
determine the DCO characteristics; and
determine the first gain coefficients and the second gain coefficients based on the DCO characteristics.

4. The system of claim 1, wherein the control circuit is configured to:
detect the phase lock of the PLL circuit based on the error signal; and
provide the first gain coefficients or the second gain coefficients to the filter based on the phase lock of the PLL circuit.

5. The system of claim 1, wherein:
the first gain coefficients include a first proportional path gain coefficient and a first integral path gain coefficient;
the second gain coefficients include a second proportional path gain coefficient and a second integral path gain coefficient;
the first proportional path gain coefficient is greater than the second proportional path gain coefficient; and
the first integral path gain coefficient is greater than the second integral path gain coefficient.

6. A system comprising:
a control circuit coupled to a phase locked loop (PLL) circuit; and
a memory storing instructions that when executed by the control circuit cause the control circuit to:

receive data for a desired output frequency of an output clock of the PLL circuit;

determine a preset value for a digitally controlled oscillator (DCO) of the PLL circuit based on the data, wherein the preset value is determined based on a linearized two-point approximation of DCO characteristics between two frequency end-points of a frequency range that includes the desired output frequency of the output clock;

determine first gain coefficients and second gain coefficients for a filter of the PLL circuit based on the data;

determine ratio values for a divider circuit of the PLL circuit based on the data;

provide the preset value to the DCO, the first gain coefficients to the filter, and the ratio values to the divider circuit while the PLL circuit operates in an open-loop configuration;

subsequently operate the PLL circuit in a closed-loop configuration by connecting the filter to the DCO; and provide the second gain coefficients to the filter in response to detecting a phase lock of the PLL circuit operating in the closed-loop configuration.

7. The system of claim 6, wherein each of the first gain coefficients is greater than a corresponding one of the second gain coefficients.

8. The system of claim 6, wherein the instructions cause the control circuit to:
determine the DCO characteristics; and
determine the first gain coefficients and the second gain coefficients based on the DCO characteristics.

9. The system of claim 6, wherein the instructions cause the control circuit to:
receive an error signal from a time-to-digital converter (TDC) of the PLL circuit;
detect the phase lock of the PLL circuit based on the error signal; and
provide the first gain coefficients or the second gain coefficients to the filter based on the phase lock of the PLL circuit.

10. The system of claim 6, wherein:
the first gain coefficients include a first proportional path gain coefficient and a first integral path gain coefficient;
the second gain coefficients include a second proportional path gain coefficient and a second integral path gain coefficient;
the first proportional path gain coefficient is greater than the second proportional path gain coefficient; and
the first integral path gain coefficient is greater than the second integral path gain coefficient.

11. A method comprising:
receiving data for a desired output frequency of an output clock of a phase locked loop (PLL) circuit;
determining a preset value for a digitally controlled oscillator (DCO) of the PLL circuit based on the data, wherein the preset value is determined based on a linearized two-point approximation of DCO characteristics between two frequency end-points of a frequency range that includes the desired output frequency of the output clock;
determining first gain coefficients and second gain coefficients for a filter of the PLL circuit based on the data;
determining ratio values for a divider circuit of the PLL circuit based on the data;

providing the preset value to the DCO, the first gain coefficients to the filter, and the ratio values to the divider circuit while the PLL circuit operates in an open-loop configuration;

subsequently operating the PLL circuit in a closed-loop configuration by connecting the filter to the DCO; and providing the second gain coefficients to the filter in response to detecting a phase lock of the PLL circuit operating in the closed-loop configuration.

12. The method of claim 11, wherein each of the first gain coefficients is greater than a corresponding one of the second gain coefficients.

13. The method of claim 11, further comprising:
determining the DCO characteristics; and
determining the first gain coefficients and the second gain coefficients based on the DCO characteristics.

14. The method of claim 11, further comprising:
receiving an error signal from a time-to-digital converter (TDC) of the PLL circuit;
detecting the phase lock of the PLL circuit based on the error signal; and
providing the first gain coefficients or the second gain coefficients to the filter based on the phase lock of the PLL circuit.

15. The method of claim 11, wherein:
the first gain coefficients include a first proportional path gain coefficient and a first integral path gain coefficient;
the second gain coefficients include a second proportional path gain coefficient and a second integral path gain coefficient;
the first proportional path gain coefficient is greater than the second proportional path gain coefficient; and
the first integral path gain coefficient is greater than the second integral path gain coefficient.

16. The system of claim 1 further comprising a calibration module configured to:
calibrate the PLL circuit when power to the PLL circuit is turned on by allowing the PLL circuit lock at the two frequency end-points and storing a control word for each of the two frequency end-points; and
determining the linearized two-point approximation of DCO characteristics using the two frequency end-points and corresponding control words;
wherein the linearized two-point approximation of DCO characteristics is an inverse of a linearized DCO gain; and
wherein the linearized DCO gain is a ratio of a difference between the two control words to a difference between the two frequency end-points.

17. The system of claim 6 wherein the instructions cause the control circuit to:
calibrate the PLL circuit when power to the PLL circuit is turned on by allowing the PLL circuit to lock at the two frequency end-points and storing a control word for each of the two frequency end-points; and
determine the linearized two-point approximation of DCO characteristics using the two frequency end-points and corresponding control words;
wherein the linearized two-point approximation of DCO characteristics is an inverse of a linearized DCO gain; and
wherein the linearized DCO gain is a ratio of a difference between the two control words to a difference between the two frequency end-points.

18. The method of claim 11 further comprising:
calibrating the PLL circuit when power to the PLL circuit is turned on by allowing the PLL circuit to lock at the two frequency end-points and by storing a control word for each of the two frequency end-points; and determining the linearized two-point approximation of DCO characteristics using the two frequency end-points and corresponding control words;

wherein the linearized two-point approximation of DCO characteristics is an inverse of a linearized DCO gain; and wherein the linearized DCO gain is a ratio of a difference between the two control words to a difference between the two frequency end-points.

* * * * *